United States Patent
Li et al.

(10) Patent No.: US 11,380,801 B2
(45) Date of Patent: Jul. 5, 2022

(54) PROCESS TO REDUCE PLASMA INDUCED DAMAGE

(71) Applicant: Applied Materials, Inc., Santa Clara, CA (US)

(72) Inventors: Jianheng Li, Santa Clara, CA (US); Lai Zhao, Campbell, CA (US); Yujia Zhai, Fremont, CA (US); Soo Young Choi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/006,261

(22) Filed: Aug. 28, 2020

(65) Prior Publication Data

US 2020/0395485 A1      Dec. 17, 2020

Related U.S. Application Data

(62) Division of application No. 16/143,786, filed on Sep. 27, 2018, now Pat. No. 10,804,408.

(Continued)

(51) Int. Cl.
  *H01L 29/786*    (2006.01)
  *H01L 21/02*    (2006.01)
  (Continued)

(52) U.S. Cl.
  CPC ...... *H01L 29/7869* (2013.01); *H01L 21/0214* (2013.01); *H01L 21/0217* (2013.01);
  (Continued)

(58) Field of Classification Search
  CPC ............. H01L 29/7869; H01L 51/0512; H01L 51/0525; H01L 51/0529; H01L 21/0214; H01L 21/02164
  See application file for complete search history.

(56) References Cited

U.S. PATENT DOCUMENTS

| 5,962,883 A | 10/1999 | Hong et al. |
| 6,927,832 B2 | 8/2005 | Cho |

(Continued)

FOREIGN PATENT DOCUMENTS

| JP | 2007081414 A | 3/2007 |
| JP | 2015084403 A | 4/2015 |

(Continued)

OTHER PUBLICATIONS

PCT Notification of Transmittal of the International Search Report and Written Opinion of the International Searching Authority for International Application No. PCT/US2018/053041; dated Jan. 17, 2019; 9 total pages.

(Continued)

*Primary Examiner* — Phat X Cao
(74) *Attorney, Agent, or Firm* — Patterson + Sheridan, LLP

(57) ABSTRACT

Embodiments described herein provide thin film transistors (TFTs) and processes to reduce plasma induced damage in TFTs. In one embodiment, a buffer layer is disposed over a substrate and a semiconductor layer is disposed over the buffer layer. A gate dielectric layer is disposed over the semiconductor layer. The gate dielectric layer contacts the semiconductor layer at an interface. The gate electrode is disposed over the gate dielectric layer. The gate dielectric layer has a $D_{it}$ of about $5e^{10}$ cm$^{-2}$ eV$^{-1}$ to about $5e^{11}$ cm$^{-2}$ eV$^{-1}$ and a hysteresis of about 0.10 V to about 0.30 V improve performance capability of the TFT while having a breakdown field between about 6 MV/cm and about 10 MV/cm.

12 Claims, 3 Drawing Sheets

Related U.S. Application Data

(60) Provisional application No. 62/571,731, filed on Oct. 12, 2017.

(51) Int. Cl.
| | |
|---|---|
| *H01L 51/05* | (2006.01) |
| *H01L 27/12* | (2006.01) |
| *H01L 29/45* | (2006.01) |
| *H01L 27/32* | (2006.01) |
| *H01L 29/66* | (2006.01) |

(52) U.S. Cl.
CPC .. *H01L 21/02164* (2013.01); *H01L 21/02211* (2013.01); *H01L 21/02274* (2013.01); *H01L 27/1225* (2013.01); *H01L 27/3244* (2013.01); *H01L 29/45* (2013.01); *H01L 51/0512* (2013.01); *H01L 51/0525* (2013.01); *H01L 29/66969* (2013.01); *H01L 2227/323* (2013.01)

(56) References Cited

U.S. PATENT DOCUMENTS

| | | | |
|---|---|---|---|
| 8,987,747 B2 * | 3/2015 | Yumoto | H01L 29/0603 257/76 |
| 9,570,621 B2 | 2/2017 | Jeong et al. | |
| 2003/0050724 A1 | 3/2003 | M'Saad et al. | |
| 2009/0278120 A1 | 11/2009 | Lee et al. | |
| 2013/0056856 A1 | 3/2013 | Zhou | |
| 2014/0256141 A1 | 9/2014 | Cao et al. | |

FOREIGN PATENT DOCUMENTS

| | | |
|---|---|---|
| KR | 20050121602 A | 12/2005 |
| KR | 1020060113449 A | 11/2006 |

OTHER PUBLICATIONS

Korean Office Action isued to Application No. 10-2020-7013164 dated Dec. 16, 2021.

* cited by examiner

US 11,380,801 B2

PROCESS TO REDUCE PLASMA INDUCED DAMAGE

CROSS-REFERENCE TO RELATED APPLICATIONS

This application is a divisional of U.S. non-provisional application Ser. No. 16/143,786 filed on Sep. 27, 2018, which claims benefit of U.S. provisional patent application Ser. No. 62/571,731, filed Oct. 12, 2017, both of which are herein incorporated by reference.

BACKGROUND

Field

Embodiments of the present disclosure generally relate to thin film transistors (TFTs) and a process to reduce plasma induced damage in TFTs.

Description of the Related Art

Flat panel displays are commonly used for active matrix displays such as computer and television monitors. Plasma-enhanced chemical vapor deposition (PECVD) is generally employed to deposit thin films on a substrate, such as a transparent substrate for flat panel display implementations. PECVD is generally accomplished by introducing a precursor gas or gas mixture into a vacuum chamber that contains a substrate. The precursor gas or gas mixture is typically directed toward the substrate through a distribution plate situated near a top of the chamber opposite the substrate. The precursor gas or gas mixture in the chamber is energized (e.g., excited) into a plasma by applying radio frequency (RF) power to the chamber from one or more RF sources coupled to the chamber. The excited gas or gas mixture reacts to form a layer of material on a surface of the substrate.

Flat panels processed by PECVD techniques are typically large, often exceeding several square meters. Gas distribution plates (or gas diffuser plates) utilized to provide uniform process gas flow over flat panels are relatively large in size, particularly as compared to gas distribution plates utilized for 200 mm and 300 mm semiconductor wafer processing. Further, as the substrates are rectangular, edges of the substrate, such as sides and corners thereof, experience conditions that may be different than the conditions experienced at other portions of the substrate. These different conditions affect processing parameters such as film thickness, deposition uniformity, and/or film stress.

PECVD is oftentimes used to deposit films for TFTs. By the very nature of the PECVD process, plasma is formed. The plasma environment can be harsh and, oftentimes, cause damage. The damage may even occur to the underlying layer upon which a subsequent layer is deposited.

Therefore, what is needed is for TFTs with reduced plasma damage and an improved process to reduce plasma induced damage.

SUMMARY

In one embodiment, a thin film transistor (TFT) is provided. The TFT includes a substrate, a gate electrode disposed on the substrate, a gate dielectric layer disposed on the gate electrode and the substrate, a semiconductor layer disposed on the gate dielectric layer, and a source electrode and a drain electrode disposed on the semiconductor layer. The gate dielectric layer has a breakdown field between about 6 MV/cm and about 10 MV/cm, an interface trap density ($D_{it}$) of about $5e^{10}$ $cm^{-2}$ $eV^{-1}$ to about $5e^{11}$ $cm^{-2}$ $eV^{-1}$, and a hysteresis of about 0.10 V to about 0.30 V.

In one embodiment, a thin film transistor (TFT) is provided. The TFT includes a substrate, a buffer layer disposed on the substrate, a semiconductor layer disposed on the buffer layer, a gate dielectric layer disposed on the semiconductor layer, a gate electrode disposed on the gate dielectric layer, an inter-layer dielectric (ILD) layer disposed on the gate dielectric layer and the gate electrode, and a source electrode disposed in a source electrode via of the ILD layer and a drain electrode is disposed in a drain electrode via of the ILD layer. The gate dielectric layer has a breakdown field between 6 MV/cm and about 10 MV/cm, an interface trap density ($D_{it}$) of about $5e^{10}$ $cm^{-2}$ $eV^{-1}$ to about $5e^{11}$ $cm^{-2}$ $eV^{-1}$, and a hysteresis of about 0.10 V to about 0.30 V.

In one embodiment, a method of fabricating a thin film transistor (TFT) is provided. The method includes flowing a deposition gas at a deposition gas flow rate into a process volume of a chamber, applying a radio frequency (RF) power to the deposition gas for an initial interval at an initial power level forming an initial zone a range of zones of a gate dielectric layer, the initial zone having a zone density with a minimum density, and increasing the initial power level in intervals forming zones of the range of zones until the RF power is applied for a final interval at a final power level forming a final zone of the range of zones, the final zone having the zone density with a maximum density, and the zone density of each zone formed has a density not less than the zone density of a prior zone.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to TFTs with reduced plasma damage and processes to reduce plasma damage on a substrate or an already deposited film during TFT fabrication. Plasma from the PECVD process can damage an already deposited film. Specifically, the exposed surface upon which a layer is to be deposited by the PECVD process can be damaged. As discussed herein, a process is disclosed that reduces and/or eliminates plasma damage.

Embodiments herein are illustratively described below in reference to a PECVD system configured to process large area substrates, such as a PECVD system, available from AKT, a division of Applied Materials, Inc., Santa Clara, Calif. It is contemplated that other suitably configured apparatus from other manufacturers may also be implemented according to the embodiments described herein. In addition, it should be understood that various implementations described herein have utility in other system configurations, such as etch systems, other chemical vapor deposition systems, or other systems in which distributing gas within a process chamber is desired, including those systems configured to process round substrates.

Figure 1:
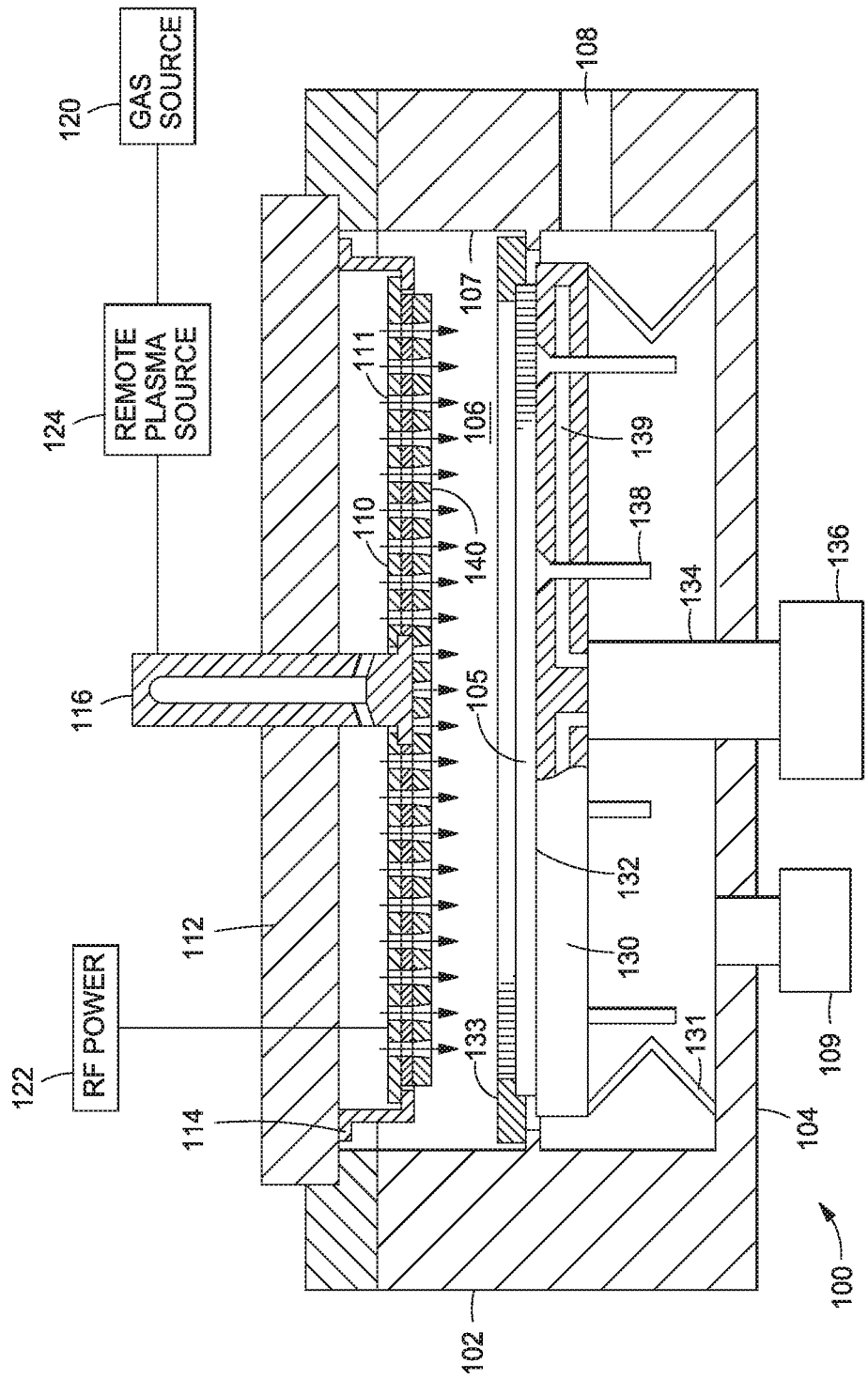
FIG. 1 illustrates a schematic, cross-sectional view of a PECVD chamber according to embodiments described herein.

FIG. 1 illustrates a schematic, cross-sectional view of a PECVD chamber 100 for forming electronic devices for flat panel displays, such as thin film transistor (TFT) devices and active matrix organic light emitting diode (AMOLED) devices. The chamber 100 includes walls 102, a bottom 104, and a diffuser 110 which define a process volume 106. More specifically, the process volume 106 is further defined by surfaces 107 of the walls 102. In one embodiment, the walls 102, bottom 104, and diffuser 110 are fabricated from a metallic material, such as aluminum, stainless steel, and alloys thereof. For example, the diffuser 110 may be formed from a 6061 aluminum alloy. In another embodiment, the diffuser 110 may be formed from an anodized aluminum material. A substrate support 130 is disposed in the process volume 106 opposite the diffuser 110. The process volume 106 is accessed through a sealable slit valve opening 108 formed through the walls 102 such that a substrate 105 may be transferred in and out of the chamber 100.

The substrate support 130 includes a substrate receiving surface 132 for supporting a substrate 105 and a stem 134 coupled to a lift system 136 to raise and lower the substrate support 130. In operation, a shadow frame 133 may be positioned over a periphery of the substrate 105 during processing. Lift pins 138 are moveably disposed through the substrate support 130 to move the substrate 105 to and from the substrate receiving surface 132 to facilitate substrate transfer. The substrate support 130 may also include heating and/or cooling elements 139 to maintain the substrate support 130 and substrate 105 positioned thereon at a desired temperature. The substrate support 130 may also include grounding straps 131 to provide RF grounding at a periphery of the substrate support 130.

The diffuser 110 is coupled to a backing plate 112 adjacent a periphery of the diffuser 110 by a suspension element 114. The diffuser 110 may also be coupled to the backing plate 112 by one or more center supports 116 to help prevent sag and/or control the straightness/curvature of the diffuser 110. A gas source 120 is fluidly coupled to the backing plate 112 to provide gas through the backing plate 112 to a plurality of gas passages 111 formed in the diffuser 110 and ultimately to the substrate receiving surface 132.

A vacuum pump 109 is coupled to the chamber 100 to control the pressure within the process volume 106. An RF power source 122 is coupled to the backing plate 112 and/or to the diffuser 110 to provide RF power to the diffuser 110 to generate an electric field between the diffuser 110 and the substrate support 130. In operation, gases present between the diffuser 110 and the substrate support 130 are energized by the RF electric field into a plasma. Various RF frequencies may be used, such as a frequency between about 0.3 MHz and about 200 MHz. In one embodiment, the RF power source 122 provides power to the diffuser 110 at a frequency of 13.56 MHz.

A remote plasma source 124 is also coupled between the gas source 120 and the backing plate 112. The remote plasma source 124 may be an inductively coupled remote plasma source, a capacitively coupled remote plasma source, or a microwave remote plasma source, depending upon the desired implementation. The remote plasma source 124 may be utilized to assist in process gas plasma generation and/or cleaning gas plasma generation.

In one embodiment, the heating and/or cooling elements 139 embedded in the substrate support 130 are utilized to maintain the temperature of the substrate support 130 and substrate 105 thereon during deposition between about 200 degrees Celsius to about 500 degrees Celsius or less.

Spacing between a top surface of the substrate 105 disposed on the substrate receiving surface 132 and a bottom surface 140 of the diffuser 110 during deposition processes may be between 400 mil and about 1,200 mil, for example between 400 mil and about 800 mil. The chamber 100 may be used to deposit various materials, such as, silicon nitride material, silicon oxide material, amorphous silicon materials, for a variety of applications, including interlayer dielectric films and gate insulator films, among others.

Figure 2:
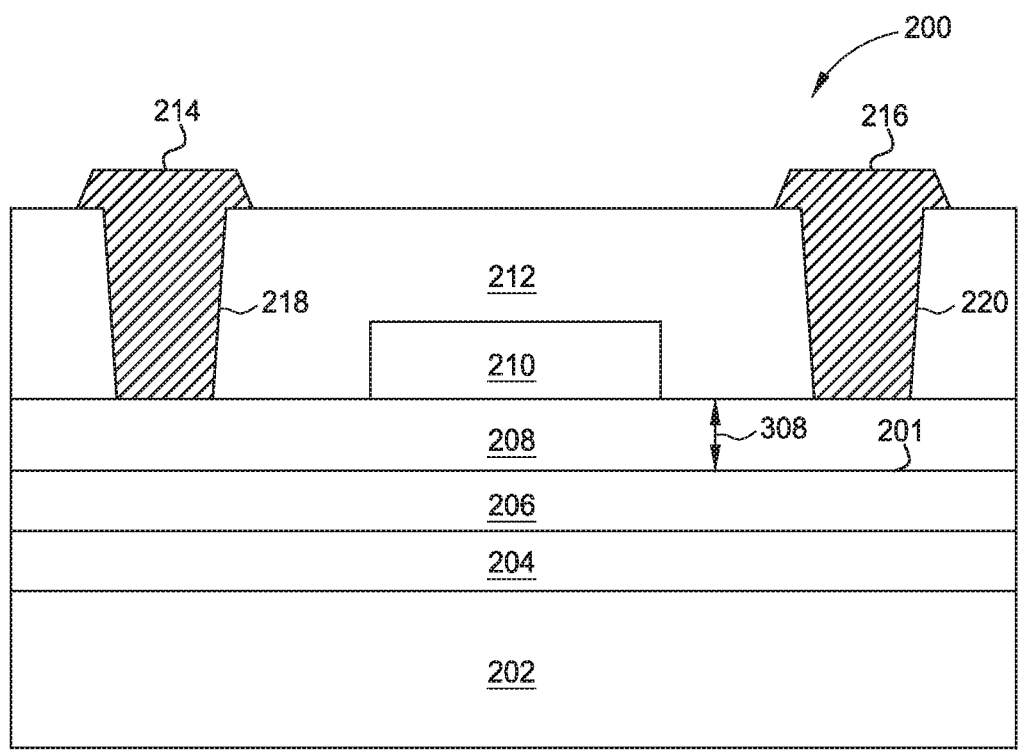
FIG. 2 illustrates a schematic, cross-sectional view of a top gate TFT according to one embodiment.

FIG. 2 illustrates a schematic, cross-sectional view of a top gate TFT 200 according to one embodiment. The top gate TFT 200 includes a substrate 202, a buffer layer 204, a semiconductor layer 206, a gate dielectric layer 208, a gate electrode 210, an inter-layer dielectric (ILD) layer 212, a source electrode 214, and a drain electrode 216. The substrate 202 may comprise any suitable material such as silicon based substrates, semiconductor based substrates, insulating based substrates, germanium based substrates, and, in general, one or more generic layers that would be present in a CMOS structure. It is to be understood that other materials are contemplated as well.

The buffer layer 204 is disposed over the substrate 202 and the semiconductor layer 206 is disposed over the buffer layer 204. In one embodiment, the buffer layer 204 includes at least one of a silicon mononitride (SiN) and a silicon dioxide ($SiO_2$) containing material, or the $SiO_2$ containing material. The semiconductor layer 206 includes a semiconductor material. In one embodiment, the semiconductor material includes at least one of a silicon, a polysilicon, a low temperature polysilicon, an amorphous silicon, an indium-gallium-zinc oxide (IGZO), and an zinc oxynitride (ZnON) containing material. It is to be understood that other materials are contemplated as well. The gate dielectric layer 208 is disposed over the semiconductor layer 206. In one embodiment, the gate dielectric layer 208 has a thickness of about 500 Angstroms to about 1500 Angstroms. The gate dielectric layer 208 contacts the semiconductor layer at an interface 201. The gate dielectric layer 208 includes an insulating material. In one embodiment, the insulating material includes at least one of a silicon mononitride (SiN), a silicon nitride ($Si_3N_4$), a silicon monoxide (SiO), a silicon dioxide ($SiO_2$), and a silicon oxynitride ($Si_2N_2O$) containing material. It is to be understood that other materials are contemplated as well. The semiconductor layer 206 and the gate dielectric layer 208 may be deposited by a plasma-enhanced chemical vapor deposition (PECVD) process.

The gate electrode 210 is disposed over the gate dielectric layer 208. ILD layer 212 is disposed over the gate electrode 210. A source electrode 214 is disposed in a source electrode via 218 of the ILD layer 212 and a drain electrode 216 is disposed in a drain electrode via 220 of the ILD layer 212. The gate electrode 210, source electrode 214, and drain electrode 216 each include a conductive material such as copper, titanium, tantalum, or any electrically conductive metal. It is to be understood that other materials are contemplated as well. In one embodiment, the material used for gate electrode 210, source electrode 214, and drain electrode 216 is the same material. In another embodiment, the material for at least one of the gate electrode 210, source electrode 214, and drain electrode 216 is different from the material used for the remaining two electrodes. In yet another embodiment, the material for the gate electrode 210, source electrode 214, and drain electrode 216 is different for each electrode. The gate electrode 210, source electrode 214, and drain electrode 216 may be deposited by physical vapor deposition (PVD). The ILD layer 212 may be made of any suitable dielectric material, such as silicon oxide. The buffer layer 204 and ILD layer 212 may be deposited by a PECVD process.

The gate dielectric layer 208 has a breakdown field between about 6 megavolts per centimeter (MV/cm) and about 10 MV/cm. The breakdown field is a result of high ion bombardment, generally due to high (RF power applied to deposition gas, in the PECVD process to densify gate dielectric layer 208. In the PECVD process the interface 201 and the semiconductor layer 206 may be damaged due to the high ion bombardment of the PECVD process. Conventionally, due to the damage to interface 201 and the semiconductor layer 206 from the high ion bombardment of the PECVD process, the gate dielectric layer 208 has an interface trap density ($D_{it}$) greater than about $5e^{11}$ cm$^{-2}$ eV$^{-1}$ and a hysteresis greater than about 0.30 V. A $D_{it}$ greater than about $5e^{11}$ cm$^{-2}$ eV$^{-1}$ and hysteresis greater than about 0.30 V may reduce to performance capability of the top gate TFT 200.

Figure 3A:
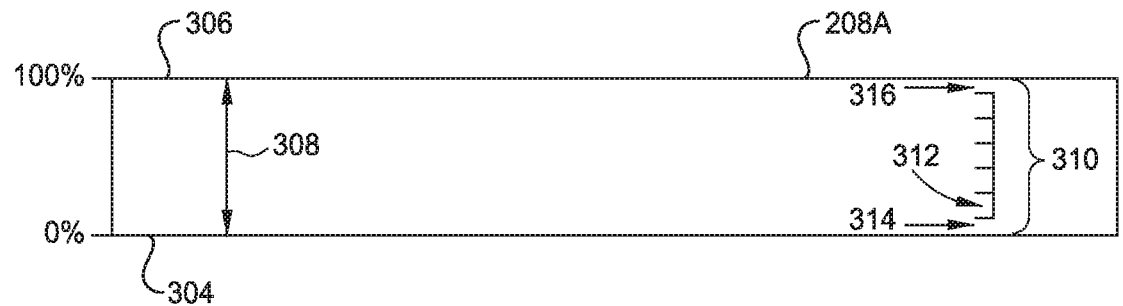
FIG. 3A illustrates a schematic, cross-sectional view of an exemplary gate dielectric layer according to one embodiment.

FIG. 3A is a schematic, cross-sectional view of an exemplary gate dielectric layer 208A. The exemplary gate dielectric layer 208A has a $D_{it}$ of about $5e^{10}$ cm$^{-2}$ eV$^{-1}$ to about $5e^{11}$ cm$^{-2}$ eV$^{-1}$ and a hysteresis of about 0.10 V to about 0.30 V improve performance capability of a the top gate TFT 200 while having a breakdown field between about 6 MV/cm and about 10 MV/cm. The $D_{it}$ of about $5e^{10}$ cm$^{-2}$ eV$^{-1}$ to about $5e^{11}$ cm$^{-2}$ eV$^{-1}$ and a hysteresis of about 0.10 V to about 0.30 V are a result of a density profile through a range of zones of a thickness of the gate dielectric layer 208A.

The gate dielectric layer 208A has a first surface 304, a second surface 306, and a thickness 308. The thickness 308 of the gate dielectric layer 208A is divided into a range of zones 310 measured from the first surface 304 corresponding to 0% of the thickness 308 to the second surface 306 corresponding to 100% of the thickness 308. Each zone 312 has a zone thickness and zone density. In one embodiment, each zone 312 has a zone thickness of about 0.001% to about 20% of the thickness 308. A density profile through the range of zones 310 of the thickness 308 has a minimum density and a maximum density. In one embodiment, an initial zone 314 of the range of zones 310 adjacent to the first surface 304 has a zone density with the minimum density, the final zone 316 of the range of zones 310 adjacent to the second surface 306 has a zone density with the maximum density, and the zone density of each zone 312 disposed immediately over a prior zone is not less than the zone density of the prior zone. In one embodiment, the maximum density is about 2.1 g/cm$^3$ and the maximum density is about 2.25 g/cm$^3$.

In one embodiment, each zone 312 has a zone thickness that is substantially the same and each zone 312 disposed immediately over a prior zone has a zone density not less than the zone density of the prior zone. In another embodiment, the increase in the zone density is a result of a PECVD process. The PECVD process includes applying a radio frequency (RF) power to the deposition gas for an initial interval at an initial power level forming the initial zone 314 a range of zones 310, and increasing the initial power level in intervals forming zones 312 of the range of zones 310 until the RF power is applied for a final interval at a final power level forming a final zone 316 of the range of zones. Each zone 312 of the range of zones 310 has substantially the same thickness and each zone 312 disposed immediately over a prior zone has a zone density not less than the zone density of the prior zone. Referring to FIG. 2, the first surface 304 of the gate dielectric layer 208A is in contact with the semiconductor layer 206 at the interface 201. The gate dielectric layer 208A has the $D_{it}$ of about $5e^{10}$ cm$^{-2}$ eV$^{-1}$ to about $5e^{11}$ cm$^{-2}$ eV$^{-1}$ and the hysteresis of about 0.10 V to about 0.30 V.

Figure 3B:
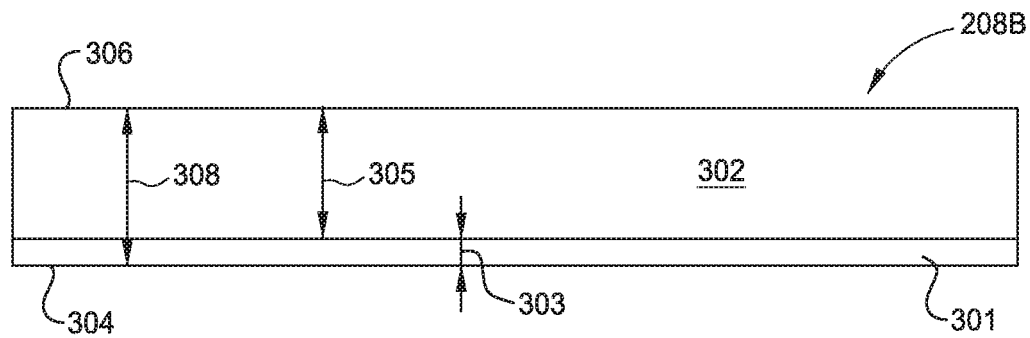
FIG. 3B illustrates a schematic, cross-sectional view of an exemplary gate dielectric layer according to one embodiment.

FIG. 3B is a schematic, cross-sectional view of an exemplary gate dielectric layer 208B. The exemplary gate dielectric layer 208B has a $D_{it}$ of about $5e^{10}$ cm$^{-2}$ eV$^{-1}$ to about $5e^{11}$ cm$^{-2}$ eV$^{-1}$ and a hysteresis of about 0.10 V to about 0.30 V improve performance capability of the top gate TFT 200 while having a breakdown field between about 6 MV/cm and about 10 MV/cm. The $D_{it}$ of about $5e^{10}$ cm$^{-2}$ eV$^{-1}$ to about $5e^{11}$ cm$^{-2}$ eV$^{-1}$ and a hysteresis of about 0.10 V to about 0.30 V are a result of an intermediate layer of the gate dielectric layer 208B having a thickness that is not greater than about 20% of the thickness of the gate dielectric layer 208B and the intermediate layer having a density not greater than the density of a bulk layer the gate dielectric layer 208B.

The gate dielectric layer 208B has a first surface 304, a second surface 306, an intermediate layer 301, a bulk layer 302, and a thickness 308. In one embodiment, the intermediate layer 301 includes the first surface 304 and the bulk layer 302 includes the second surface 306. The bulk layer 302 disposed over the intermediate layer 301. The thickness 308 includes a thickness 303 of the intermediate layer 301 and thickness 305 of the bulk layer 302. The intermediate layer 301 has a thickness 303 that is not greater than about 20% of the thickness 308. The intermediate layer 301 has a density not greater than the density of the bulk layer 302. In one embodiment, the density of the bulk layer 302 is greater than about 2.15 g/cm$^3$. $^{-2-2}$Referring to FIG. 2, the first surface 304 of the gate dielectric layer 208B is in contact with the semiconductor layer 206 at the interface 201. The gate dielectric layer 208B has the $D_{it}$ of about $5e^{10}$ cm$^{-2}$eV$^{-1}$ to about $5e^{11}$ cm$^{-2}$ eV$^{-1}$ and the hysteresis of about 0.10 V to about 0.30 V.

Figure 4:
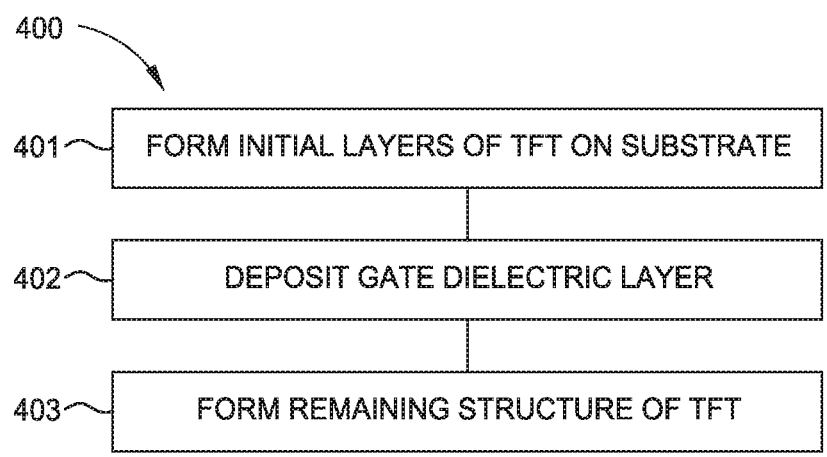
FIG. 4 is a flow diagram of a method of fabricating a top gate TFT according to one embodiment.

FIG. 4 is a flow diagram of a method 400 of fabricating a top gate TFT. In one embodiment, the chamber 100 is utilized for the method 400. At optional operation 401, initial layers of the TFT are formed on a substrate 202. In one embodiment, a buffer layer 204 is deposited over the substrate 202 and the semiconductor layer 206 is deposited over the buffer layer 204 by PECVD processing. At operation 402, the gate dielectric layer 208 is deposited.

In one embodiment, a gate dielectric layer 208A is deposited by a single-step PECVD process. The single-step PECVD process includes flowing a deposition gas at a deposition gas flow rate into the process volume 106 of the chamber 100 and applying RF power to the deposition gas. In one embodiment, the deposition gas includes silane (SiH₄), nitrous oxide (N₂O), and Argon (Ar). The deposition gas flow rate includes about 800 sccm to about 1600 sccm of SiH₄, about 30000 sccm to about 70000 sccm of N₂O, and about 40000 sccm to about 70000 sccm of Ar. In one embodiment, the RF power source 122 provides RF power to the diffuser 110. The RF power is applied an initial power level and a frequency at an initial interval. The initial power level is increased in intervals, also known as ramped, until the RF power is applied at a final power level at a final interval. In one embodiment, the intervals are 0.5 about seconds to about 2 seconds. The initial power level may be increase in a step-wise, exponentially, or literally in the intervals until the RF power is applied at a final power level. In one embodiment, the RF power is about 2000 Watts (W) to about 16000 W. For example, the initial power level is about 2000 W to about 5000 W and the final power level is about 12000 W to about 16000 W. Increasing the initial power results in the gate dielectric layer 208A divided into a range of zones 310 measured from the first surface 304 corresponding to 0% of the thickness 308 to the second surface 306 corresponding to 100% of the thickness 308. Each zone 312 has a zone thickness and zone density. In one embodiment, each zone 312 has a zone thickness of about 0.001% to about 20% of the thickness 308.

A density profile through the range of zones 310 of the thickness 308 has a minimum density and a maximum density. In one embodiment, an initial zone of the range of zones 310 adjacent to the first surface 304 and corresponding to the initial interval has a zone density with the minimum density, the final zone 316 of the range of zones 310 adjacent to the second surface 306 and corresponding to the final interval has a zone density with the maximum density, and the zone density of each zone 312 deposited immediately over a prior zone is not less than the zone density of the prior zone. The density profile is a result of increasing the initial power level in intervals that reduces plasma damage to an underlying layer from ion bombardment. In one embodiment, each zone 312 has a zone thickness that is substantially the same and each zone 312 disposed immediately over a prior zone has a zone density not less than the zone density of the prior zone. In another embodiment, the increase in the zone density is a result of ramping the RF power. Applying the RF power to the deposition gas for the initial interval at the initial power level forming the initial zone 314 a range of zones 310, increasing the initial power level in intervals forming zones 312 of the range of zones 310 until the RF power is applied for a final interval at a final power level forming a final zone 316 of the range of zones may result in each zone 312 of the range of zones 310 having substantially the same thickness and each zone 312 disposed immediately over a prior zone having a zone density not less than the zone density of the prior zone.

In another embodiment, an initial pressure in the process volume 106 at the initial interval is decreased in the intervals until a final pressure at the final interval. In one embodiment, the initial pressure of about 900 mTorr to about 1300 mTorr is decreased in the intervals. Each zone 312 of the range of zones 310 corresponding to each interval has a zone thickness and a zone density. The initial zone of the range of zones 310 corresponding to the initial interval has a zone density with the minimum density, the final zone 316 of the range of zones 310 corresponding to the final interval has a zone density with the maximum density, and the zone density of each zone deposited immediately over a prior zone has a zone density not less than the zone density of the prior zone.

In one embodiment, a gate dielectric layer 208B is deposited by a two-step PECVD process. The two-step PECVD process includes flowing a deposition gas at a deposition gas flow rate into the process volume 106 of the chamber 100 and applying RF power to the deposition gas. In one embodiment, the RF power source 122 provides RF power to the diffuser 110. The RF power is applied an initial power level and a frequency and the process volume 106 has an initial pressure for an initial interval until an intermediate layer 301 of the gate dielectric layer 208B is deposited. The RF power is applied a final power level and the process volume 106 has a final pressure for a final interval until a bulk layer 302 of the gate dielectric layer 208B is deposited. In one embodiment, the initial power level is greater than the final power level. In another embodiment, the final pressure is less than the initial pressure. In one embodiment, the RF power is about 2000 Watts (W) to about 16000 W. For example, the initial power level is about 2000 W to about 5000 W and the final power level is about 12000 W to about 16000 W. In one embodiment, the initial pressure is about 900 mTorr to about 1300 mTorr. The intermediate layer 301 has a thickness 303 that is not greater than about 20% of the thickness 308. The intermediate layer 301 has a density not greater than the density of the bulk layer 302. The intermediate layer 301 deposited at the initial power level reduces plasma damage to an underlying layer from ion bombardment at the final power level depositing the bulk layer 302 of the gate dielectric layer 208B.

At operation 403, the remaining structure of the TFT is formed. In one embodiment, a gate electrode 210 is formed over the gate dielectric layer 208 by PVD processing. An ILD layer 212 is deposited over the gate electrode 210 by PECVD processing. A source electrode 214 is formed by PVD processing in a source electrode via 218 formed in the ILD layer 212 and a drain electrode 216 is formed by PVD processing in a drain electrode via 220 formed in the ILD layer 212.

In summation, TFTs and methods of fabricating TFTs having a gate dielectric layer are described herein. The gate dielectric layer has a $D_{it}$ of about $5e^{10}$ $cm^{-2}$ $eV^{-1}$ to about $5e^{11}$ $cm^{-2}$ $eV^{-1}$ and a hysteresis of about 0.10 V to about 0.30 V to improve performance capability of the top gate TFT 200 while having a breakdown field between about 6 MV/cm and about 10 MV/cm. The single-step PECVD process forms a gate dielectric layer with a density profile through range of zones of the thickness of the gate dielectric layer. The initial zone of the range of zones adjacent to the underlying layer has a zone density with the minimum density, the finial zone of the range of has a zone density with the maximum density, and the zone density of each zone deposited immediately over a prior zone is not less than the zone density of the prior zone. The density profile is a result of increasing the initial power level in intervals that reduces plasma damage to an underlying layer from ion bombardment. The two-step PECVD process forms a gate dielectric layer with an intermediate layer and a bulk layer. The intermediate layer has a thickness that is not greater than about 20% of the thickness of the gate dielectric layer and has a density not greater than the density of the bulk layer. The intermediate layer deposited at the initial power level reduces plasma damage to an underlying layer from ion bombardment at the final power level depositing the bulk layer of the gate dielectric layer.

While the foregoing is directed to examples of the present disclosure, other and further examples of the disclosure may be devised without departing from the basic scope thereof, and the scope thereof is determined by the claims that follow.

What is claimed is:

1. A thin film transistor (TFT), comprising:
a gate dielectric layer disposed on a semiconductor layer, the gate dielectric layer having a first surface and a second surface, the first surface contacts the semiconductor layer at an interface, the gate dielectric layer has a breakdown field between about 6 MV/cm and about 10 MV/cm, an interface trap density ($D_{it}$) of about $5e^{10}$ cm$^{-2}$ eV$^{-1}$ to about $5e^{11}$ cm$^{-2}$ eV$^{-1}$, and a hysteresis of about 0.10 V to about 0.30 V, the gate dielectric layer comprises:
a thickness divided into a range of zones from the first surface corresponding to 0% of the thickness to the second surface corresponding to 100% of the thickness, each zone of the range of zones having a zone thickness and zone density; and
a density profile through the range of zones having a minimum density and a maximum density, wherein:
an initial zone of the range of zones adjacent to the first surface has the zone density with the minimum density; and
a finial zone of the range of zones adjacent to the second surface has the zone density with the maximum density, the zone density of each zone disposed immediately over a prior zone is not less than the zone density of the prior zone.

2. The TFT of claim 1, further comprising: a substrate; and
a buffer layer disposed on the substrate, the semiconductor layer disposed on the buffer layer.

3. The TFT of claim 2, further comprising:
a gate electrode disposed on the gate dielectric layer, the gate electrode contacting the second surface of the gate dielectric layer,
an inter-layer dielectric (ILD) layer disposed on the gate dielectric layer and the gate electrode; and
a source electrode disposed in a source electrode via of the ILD layer and a drain electrode is disposed in a drain electrode via of the ILD layer.

4. The TFT of claim 3, wherein the gate electrode, the source electrode, and the drain electrode each comprises at least one of a copper, a titanium, and a tantalum containing material.

5. The TFT of claim 2, wherein the buffer layer comprises at least one of a silicon mononitride (SiN) and a silicon dioxide (SiO$_2$) containing material, or the SiO$_2$ containing material.

6. The TFT of claim 1, wherein the zone thickness is about 0.001% to about 20% of the thickness.

7. The TFT of claim 1, wherein the gate dielectric layer has a thickness of about 500 Angstroms to about 1500 Angstroms.

8. The TFT of claim 1, wherein the semiconductor layer includes at least one of a silicon, a polysilicon, a low temperature polysilicon, an amorphous silicon, an indium-gallium-zinc oxide (IGZO), and a zinc oxynitride (ZnON) containing material.

9. The TFT of claim 1, wherein the gate dielectric layer comprises at least one of a SiN, a silicon nitride (Si$_3$N$_4$), a silicon monoxide (SiO), a silicon dioxide SiO$_2$, and a silicon oxynitride Si$_2$N$_2$O containing material.

10. A thin film transistor (TFT),
comprising: a substrate;
a buffer layer disposed on the substrate;
a semiconductor layer disposed on the buffer layer;
a gate dielectric layer disposed on the semiconductor layer, the gate dielectric layer having a first surface and a second surface, the first surface contacts the semiconductor layer at an interface, the gate dielectric layer has a breakdown field between about 6 MV/cm and about 10 MV/cm, an interface trap density ($D_{it}$) of about $5e^{10}$ cm$^{-2}$ eV$^{-1}$ to about $5e^{11}$ cm$^{-2}$ eV$^{-1}$, and a hysteresis of about 0.10 V to about 0.30 V, the gate dielectric layer comprises:
a thickness divided into a range of zones from the first surface corresponding to 0% of the thickness to the second surface corresponding to 100% of the thickness, each zone of the range of zones having a zone thickness and zone density; and
a density profile through the range of zones having a minimum density and a maximum density, wherein:
an initial zone of the range of zones adjacent to the first surface has the zone density with the minimum density; and
a finial zone of the range of zones adjacent to the second surface has the zone density with the maximum density, the zone density of each zone disposed immediately over a prior zone is not less than the zone density of the prior zone;
a gate electrode disposed on the gate dielectric layer, the gate electrode contacting the second surface of the gate dielectric layer,
an inter-layer dielectric (ILD) layer disposed on the gate dielectric layer and the gate electrode; and
a source electrode disposed in a source electrode via of the ILD layer and a drain electrode is disposed in a drain electrode via of the ILD layer.

11. The TFT of claim 10, wherein the zone thickness is about 0.001% to about 20% of the thickness.

12. The TFT of claim 10, wherein the gate dielectric layer has a thickness of about 500 Angstroms to about 1500 Angstroms.

* * * * *

UNITED STATES PATENT AND TRADEMARK OFFICE
CERTIFICATE OF CORRECTION

PATENT NO. : 11,380,801 B2
APPLICATION NO. : 17/006261
DATED : July 5, 2022
INVENTOR(S) : Jianheng Li et al.

It is certified that error appears in the above-identified patent and that said Letters Patent is hereby corrected as shown below:

On the Title Page

On the page 2, in Column 2, under "Other Publications", Line 1, delete "isued" and insert -- issued --.

In the Specification

In Column 5, Line 24, delete "(RF" and insert -- RF --.

In Column 5, Line 41, delete "a the" and insert -- the --.

In Column 8, Line 51, delete "finial" and insert -- final --.

In the Claims

In Column 9, Line 26, in Claim 1, delete "finial" and insert -- final --.

In Column 10, Line 11, in Claim 9, delete "SiO$_2$," and insert -- (SiO$_2$), --.

In Column 10, Line 12, in Claim 9, delete "Si$_2$N$_2$O" and insert -- (Si$_2$N$_2$O) --.

In Column 10, Line 35, in Claim 10, delete "finial" and insert -- final --.

Signed and Sealed this
First Day of November, 2022

*Katherine Kelly Vidal*
Katherine Kelly Vidal
*Director of the United States Patent and Trademark Office*